(12) United States Patent
Zhang

(10) Patent No.: US 9,318,650 B2
(45) Date of Patent: Apr. 19, 2016

(54) LIGHT-EMITTING DEVICE WITH HEAVILY DOPED ACTIVE-REGION AND METHOD FOR MANUFACTURING THE SAME

(71) Applicant: QINGDAO JASON ELECTRIC CO., LTD., Qingdao (CN)

(72) Inventor: Jianping Zhang, Qingdao (CN)

(73) Assignee: QINGDAO JASON ELECTRIC CO., LTD., Shandong (CN)

(*) Notice: Subject to any disclaimer, the term of this patent is extended or adjusted under 35 U.S.C. 154(b) by 106 days.

(21) Appl. No.: 14/210,083

(22) Filed: Mar. 13, 2014

(65) Prior Publication Data

US 2015/0263224 A1    Sep. 17, 2015

(51) Int. Cl.
*H01L 33/06* (2010.01)
*H01L 33/00* (2010.01)
*H01L 33/32* (2010.01)
*H01L 33/04* (2010.01)

(52) U.S. Cl.
CPC .............. *H01L 33/06* (2013.01); *H01L 33/007* (2013.01); *H01L 33/04* (2013.01); *H01L 33/32* (2013.01)

(58) Field of Classification Search
CPC ....... H01L 33/06; H01L 33/002; H01L 33/32; H01L 33/0008; H01L 33/0075
See application file for complete search history.

(56) References Cited

U.S. PATENT DOCUMENTS

| 7,348,606 B2 | 3/2008 | Khan et al. ............ 257/103 |
| 2012/0211724 A1* | 8/2012 | Kikuchi ............ H01L 33/06 257/13 |

OTHER PUBLICATIONS

E. T. Yu et al., "Spontaneous and piezoelectric polarization effects in III-V nitride heterostructures" Journal of Vacuum Science & Technology B, vol. 17, Issue 4, Jul./Aug. 1999, pp. 1742-1749.

Jian Ping Zhang et al., "Quarternary AlInGaN Multiple quantum Wells for Ultraviolet Light Emitting Diodes" Japanese Journal of Applied Physics, vol. 40, Part 2, No. 9A/B, Sep. 15, 2001, pp. L921-L924.

J. P. Zhang et al., "Milliwatt power deep ultraviolet light-emitting diodes over sapphire with emission at 278nm" Applied Physics Letters, vol. 81, No. 26, Dec. 23, 2002, pp. 4910-4912.

B. Cheng et al., "Enhanced vertical and lateral hole transport in high aluminum-containing AlGaN for deep ultraviolet light emitters" Applied Physics Letters, vol. 102, No. 23, (2013), pp. 231106-1-231106-4.

Stephane Brochen et al., "Dependence of the Mg-related acceptor ionization energy with the acceptor concentration in p-type GaN layers grown by molecular beam epitaxy" Applied Physics Letters, vol. 103, No. Issue 3, (2013), pp. 032102-1-032102-4.

* cited by examiner

*Primary Examiner* — Matthew W Such
*Assistant Examiner* — Scott Stowe
(74) *Attorney, Agent, or Firm* — J.C. Patents

(57) ABSTRACT

A light emitting device is provided, which includes an n-type layer, a p-type layer, and an active region sandwiched between the n-type layer and the p-type layer. The active-region includes one or more quantum wells each sandwiched by quantum barriers, at least one of the quantum wells has a polarization induced electric field equal to or greater than $10^6$ V/cm, and at least one of the quantum barriers adjacent to the at least one of the quantum wells is doped to generate a PN junction maximum electric field equal to or greater than the polarization induced electric field to substantially cancel out the polarization induced electric field within the at least one of the quantum wells.

17 Claims, 7 Drawing Sheets

LIGHT-EMITTING DEVICE WITH HEAVILY DOPED ACTIVE-REGION AND METHOD FOR MANUFACTURING THE SAME

FIELD OF THE INVENTION

The present invention relates in general to a polar semiconductor, such as group III nitride, light-emitting device, more particularly to a light-emitting device such as an ultraviolet light-emitting device with heavily doped active-region and a method for manufacturing the same.

DESCRIPTION OF THE RELATED ART

Nitride semiconductor based light-emitting diodes (LEDs) have achieved fast progress in recent years. In the visible spectrum regime, InGaN LEDs are increasingly challenging traditional lighting sources such as fluorescent lamps, due to their technological and economical advantages, and high-efficiency InGaN LED white light lamps with efficacy over 130 lm per watt are commercially available. In the ultraviolet (UV) regime, especially in the UVB (315 nm-280 nm) and UVC (≤280 nm) regimes, AlGaN LEDs, even though still in the technological debut stage, have already outperformed the traditional UV light sources in duration, compactness, and UV-power-density aspects. High-efficiency UVC LEDs will lead to numerous disinfection applications taking advantage of the UV light germicidal effect, making revolutionary advances in food safety, water treatment, and medical applications.

Currently, most UV LEDs with emissions shorter than 350 nm adopt the layer structure developed by Zhang et al, which contains a c-plane sapphire as UV transparent substrate, a high-quality AlN layer coated over the substrate serving as epitaxy template, and a set of AlN/AlGaN superlattice for dislocation and strain management. The utilization of high-quality AlN template and AlN/AlGaN superlattice enables the growth of high-quality high-conductivity n-type AlGaN electron supplier layer, which injects electrons into the following AlGaN-based multiple quantum well (MQW) active-region. On the other side of the MQW active-region are an AlGaN electron-blocking layer, an AlGaN hole injection layer, a hole supplier layer and a p-type GaN layer for ohmic contact formation. The prior art AlGaN LED structures can be found in the reference. ("Milliwatt power deep ultraviolet light-emitting diodes over sapphire with emission at 278 nm", J. P. Zhang, et al, APPLIED PHYSICS LETTERS 81, 4910 (2002), the content of which is incorporated herein by reference in its entirety).

On the other hand, group III nitrides are polar semiconductors. This means that interface space charges are inevitably generated when forming heterostructures using nitrides, due to the discontinuity of spontaneous and piezoelectric polarizations at the heterointerface. The spontaneous and piezoelectric polarizations in nitrides have maximum values along c-direction (<0001>), and the resultant interface space charge density in GaN/InGaN and AlGaN/AlGaN c-oriented heterostructures can exceed $10^{13}$ cm$^2$, leading to electric field greater than $10^6$ V/cm resulting in strong band structure distortion. The polarization induced electric field within the MQW active region leads to high device forward voltage and low internal quantum efficiency.

In the prior art, quaternary AlInGaN materials have been proposed to replace binary (AlN, GaN, and InN) and ternary (AlGaN, AlInN and InGaN) materials for heterostructure formation, owing to the flexibility of nearly independent bandgap and lattice constant adjustment in the quaternaries for a reduced polarization mismatch. (e.g.: "Quaternary AlInGaN Multiple Quantum Wells for Ultraviolet Light Emitting Diodes", J. P. Zhang, et al, Jpn J. Appl. Phys. 40, L921-L924 (2001); U.S. Pat. No. 7,348,606; the contents of these two references are incorporated herein by reference in their entirety). In principle, quaternary heterostructure approach can result in high quantum efficiency for MQW active-regions. However, since the optimal incorporation conditions of Al and In are not compatible with each other, it is difficult to obtain high-quality AlInGaN quaternary materials.

The present invention discloses MQW embodiments having reduced polarization field and improved quantum confinement effect, and provides ultraviolet LEDs with improved efficiency and reduced forward voltage with heavily doping active-region.

SUMMARY OF THE INVENTION

According to one aspect of the present invention, dopant induced electric field such as PN junction built-in electric field is utilized to compensate and reduce polarization induced electric field within a quantum well such as multiple quantum wells and/or other heterostructures, giving rise to improved electron-hole wavefunction overlapping and reduced carrier injection impedance.

Another aspect of the present invention provides an AlInGaN-based solid-state ultraviolet light emitting device, comprising at least an n-type doped Al-containing electron supplier layer, a heavily n-type doped Al-containing quantum bather, an Al-containing quantum well, an unintentionally doped Al-containing last quantum bather, an Al-containing electron blocking layer, and a heavily p-type doped Al-containing layer or structure. The ionized p-type dopants in the heavily p-type doped Al-containing layer or structure and the ionized n-type dopants in the heavily n-type doped quantum barrier and the n-type electron supplier layer build up a strong PN junction electric field substantially cancelling out the polarization induced electric field within the quantum well.

Another aspect of the present invention provides an AlInGaN-based solid-state ultraviolet light emitting device, comprising at least an n-type doped Al-containing electron supplier layer, a heavily n-type doped Al-containing quantum barrier with Si or Ge concentration of $1\times10^{18}$ cm$^{-3}$ to $1\times10^{19}$ cm$^{-3}$, preferably to be of $1\times10^{18}$ cm$^{-3}$ to $8\times10^{18}$ cm$^{-3}$, an Al-containing quantum well, an unintentionally doped Al-containing last quantum bather, an Al-containing electron blocking layer, and a heavily p-type doped Al-containing layer or structure with Mg concentration of $5\times10^{18}$ cm$^{-3}$ to $2\times10^{20}$ cm$^{-3}$, preferably to be of $1\times10^{19}$ cm$^{-3}$ to $1\times10^{20}$ cm$^{-3}$. The ionized p-type dopants in the heavily p-type doped Al-containing layer or structure and the ionized n-type dopants in the heavily n-type doped quantum barrier and the n-type electron supplier layer build up a PN junction electric field stronger than $10^6$ V/cm, substantially cancelling out the polarization induced electric field within the quantum well.

Another aspect of the present invention provides a light emitting device including:

an n-type layer;
a p-type layer, and,
an active region sandwiched between the n-type layer and the p-type layer, and the active-region comprising one or more quantum wells each sandwiched by quantum bathers, wherein at least one of the quantum wells has a polarization induced electric field, and at least one of the quantum barriers adjacent to the at least one of the quantum wells is doped to generate a PN junction maximum electric field equal to or greater than the polarization induced electric field to substantially cancel out the polarization induced electric field within the at least one of the quantum wells. The polarization induced electric field can be equal to or greater than $10^6$ V/cm.

In some embodiments, each of the quantum wells has a polarization induced electric field, respectively, and each of the quantum barriers is doped to generate a PN junction maximum electric field equal to or greater than the polarization induced electric field of a corresponding quantum well to substantially cancel out the polarization induced electric field within each of the quantum wells.

Another aspect of the present invention provides a method to form a solid-state light emitting device such as an ultraviolet light emitting device, the method includes:

Determining quantum barrier and quantum well AlInGaN compositions for the desired emission wavelength;

Calculating strain for the quantum well coherently formed over the quantum barrier;

Calculating the quantum barrier/quantum well interface charge density including spontaneous and piezoelectric polarizations;

Calculating polarization induced electric field in the quantum well;

Calculating acceptor and donor concentrations in order to have maximum PN junction built-in electric field comparable to the quantum well polarization electric field;

Forming at least one quantum barrier with the calculated compositions and doping level over an n-type Al-containing electron supplier layer;

Forming at least one quantum well with the calculated compositions over the quantum barrier;

Forming a last quantum barrier;

Forming an Al-containing electron blocking layer over the last quantum bather;

Forming an Al-containing layer or structure with the calculated acceptor doping level over the electron blocking layer.

The light-emitting device formed according to the present invention has quantum wells substantially free of electric field, possessing high internal quantum efficiency.

BRIEF DESCRIPTION OF THE DRAWINGS

The accompanying drawings, which are included to provide a further understanding of the invention and constitute a part of this application, illustrate embodiments of the invention and together with the description serve to explain the principle of the invention. Like reference numbers in the figures refer to like elements throughout, and a layer can refer to a group of layers associated with the same function.

DETAILED DESCRIPTION OF EMBODIMENTS

The present invention discloses a light emitting device with improved quantum efficiency and forward voltage. Throughout the specification, the term III-nitride or nitride in general refers to metal nitride with cations selecting from group IIIA of the periodic table of the elements. That is to say, III-nitride includes MN, GaN, InN and their ternary (AlGaN, InGaN, InAlN) and quaternary (AlInGaN) alloys. III-nitride or nitride can also include small compositions of transition metal nitride such as TiN, ZrN, HfN with molar fraction not larger than 10%. For example, III-nitride or nitride may include $Al_xIn_yGa_zTi_{(1-x-y-z)}N$, $Al_xIn_yGa_zZr_{(1-x-y-z)}N$, $Al_xIn_yGa_zHf_{(1-x-y-z)}N$, with (1-x-y-z)≤10%. A III-nitride layer or active-region means that the layer or active-region is made of III-nitride semiconductors.

In the following contents, c-plane nitride light-emitting devices or structures are used as embodiments to elucidate the principle and spirit of the present invention. Those of ordinary skills in the field can apply the teachings in this specification and given by the following embodiments to non-c-plane nitride semiconductors, II-VI semiconductors and other polar semiconductors devices or light-emitting devices without creative work.

Figure 1A:
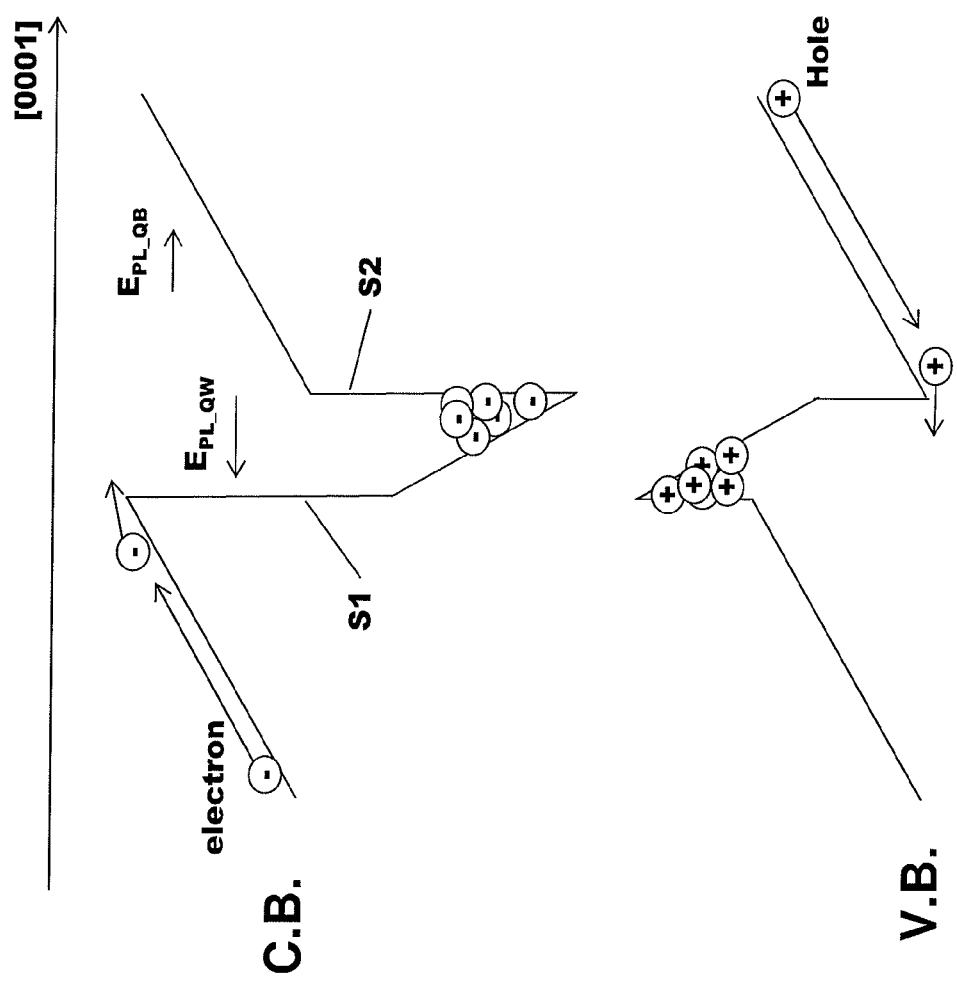
FIG. 1A illustrates the band structure of a quantum well of a prior art UV LED.

Illustrated in FIG. 1A is the band structure of a quantum well in a UV LED active-region. For simplicity, only one quantum well embedded in two quantum barriers is shown to highlight the band structure distortion. Two heterointerfaces, S1, and S2 are formed between the quantum well and the corresponding quantum bathers. Electrons in the conduction band (C.B.) and holes in the valence band (V.B.) are injected into the quantum well through S1 from the left side and S2 from the right side, respectively. Due to the polarization discontinuity at the heterointerfaces, there are negative space charges on S1 and positive space charges on S2 (interface charges not shown in FIG. 1A, see FIG. 1B for calculations), building up an electric field $E_{PL\_QW}$ in the quantum well pointing from S2 to S1 (against c-direction). Since usually there are more than one quantum wells in the active region, the neighboring interface space charges also give rise to another electric field $E_{PL\_QB}$ in the quantum barriers, pointing in the opposite direction of $E_{PL\_QW}$. Electric fields $E_{PL\_QW}$ and $E_{PL\_QB}$ thus tilt the band structure of the MQW active-region. $E_{PL\_QB}$ impedes electrons and holes injection into the quantum wells, whereas $E_{PL\_QW}$ reduces the wavefunction overlapping of electrons and holes in the quantum wells.

Figure 1B:
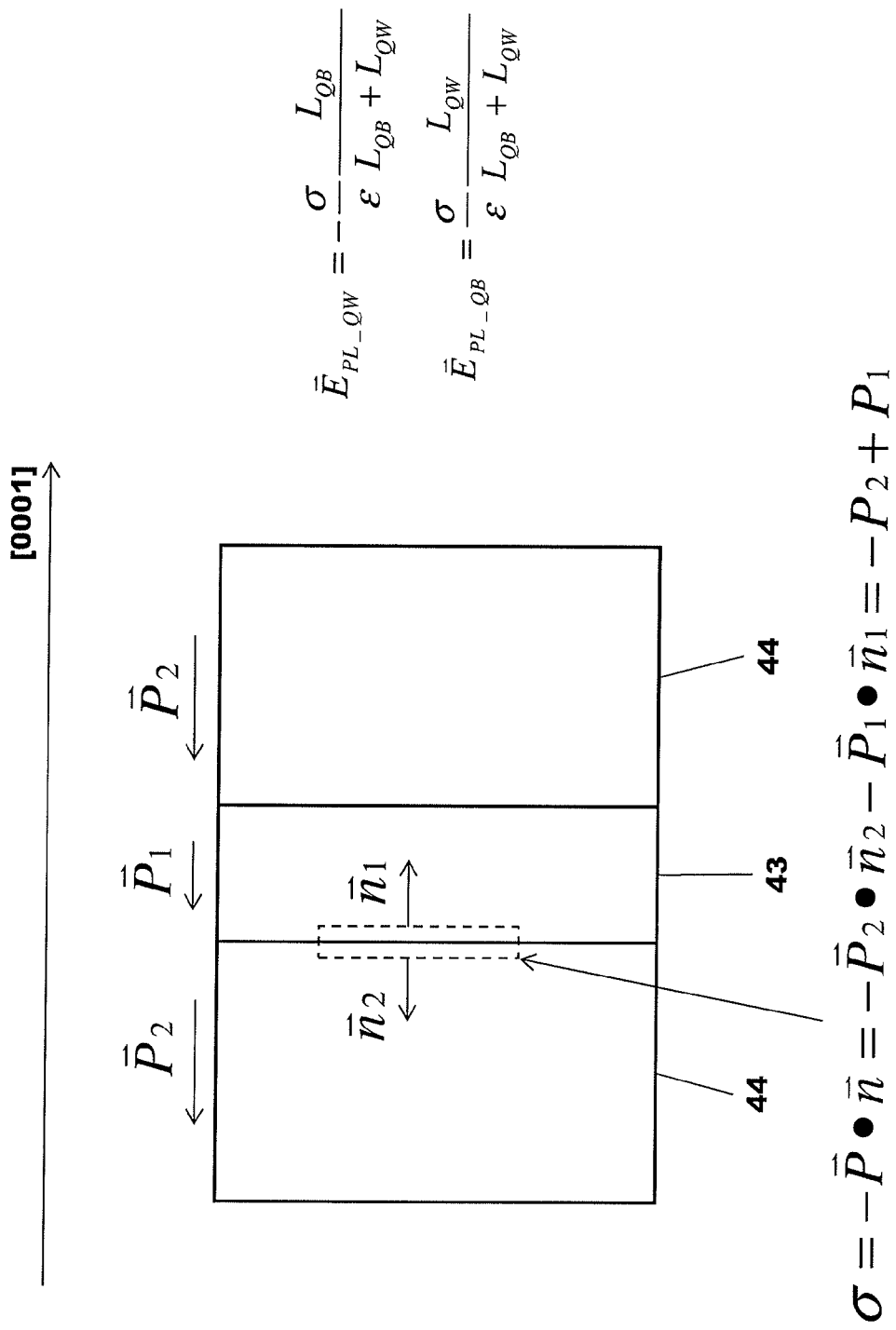
FIG. 1B illustrates a multiple quantum well structure and method to calculate quantum well-quantum barrier interface charge density and polarization induced electric field.

In order to deal with the polarization-induced electric field in polar semiconductor heterostructures, an important step is to calculate the polarization induced interface charge density and the resultant electric field. Shown in FIG. 1B is the layered structure of a c-orientated (epitaxy plane being (0001)) AlInGaN quantum well structure corresponding to the band structure shown in FIG. 1A. Quantum barrier 44 and quantum well 43 are of different polarization vectors $\vec{P}_2$ and $\vec{P}_1$, respectively. The polarization discontinuity at the barrier/well interfaces generates interface charges. At the left interface (S1), the interface charge density, σ, is $\sigma = -\vec{P} \cdot \vec{n} = -\vec{P}_2 \cdot \vec{n}_2 - \vec{P}_1 \cdot \vec{n}_1 = -P_2 + P_1$ given by ($\vec{n}_1$) denotes interface normal):

The interface charge density at the right interface (S2) is of the same value but with opposite sign. Usually, quantum barrier material is of greater polarization than quantum well. Therefore, the polarization discontinuity shown in FIG. 1A and FIG. 1B produces negative and positive interface charges on S1 and S2, respectively. These interface sheet charges generate electric field resulting in band edge tilt shown in FIG. 1A.

The polarization vector $\vec{P}_1$ of quantum well 43 when coherently formed on quantum barrier 44 contains spontaneous ($\vec{P}_{1sp}$) and piezoelectric ($\vec{P}_{1pz}$) polarizations, i.e., $\vec{P}_1 = \vec{P}_{1sp} + \vec{P}_{1pz}$. To obtain piezoelectric polarization, strain ($\xi$) of quantum well coherently formed on quantum barrier is calculated according to, $$\xi = \frac{a_{QB} - a_{QW}}{a_{QW}},$$

$a_{QB}$ and $a_{QW}$ being strain-free in-plane lattice constants of quantum barrier and well, respectively. The group III nitride material polarization parameters and method to calculate piezoelectric polarization can be found in reference (e.g. "Spontaneous and piezoelectric polarization effects in III-V nitride heterostructures", E. T. Yu, et al, J. Vac. Sci. Technol. B17, 1742 (1999), the content of which is incorporated herein by reference in its entirety).

For a multiple quantum well structure consisting of more than one pairs of quantum wells and quantum barriers, the polarization induced electric fields considered the periodic constraint within quantum well ($\vec{E}_{PL_{QW}}$) and quantum barrier ($\vec{E}_{PL_{QB}}$) are given by, $$\vec{E}_{PL\_QW} = -\frac{\sigma}{\varepsilon} \frac{L_{QB}}{L_{QB} + L_{QW}}$$

$$\vec{E}_{PL\_QB} = \frac{\sigma}{\varepsilon} \frac{L_{QW}}{L_{QB} + L_{QW}}$$

Where $L_{QB}$, $L_{QW}$ are quantum barrier and well thicknesses, respectively, $\in$ is the average dielectric constant.

Using the above mentioned three equations, polarization induced electric field in III-nitride heterostructures and multiple quantum wells of any given compositions can be calculated.

In some embodiments, quantum barrier 44 and quantum well 43 shown in FIG. 1B are made of 10-nm-thick GaN and 2-nm-thick $In_{0.2}Ga_{0.8}N$, respectively (typical blue LED MQW). In these embodiments, the calculated polarization electric fields are, $$\vec{E}_{PL_{QW}} = -2.57 \times 10^6 \frac{V}{cm}, \vec{E}_{PL_{QB}} = 5.15 \times 10^6 \frac{V}{cm}.$$

In some embodiments, quantum barrier 44 and quantum well 43 shown in FIG. 1B are made of 10-nm-thick $Al_{0.6}Ga_{0.4}N$ and 2.5-nm-thick $Al_{0.4}Ga_{0.6}N$, respectively (typical 280 nm UV LED MQW). In these embodiments, the calculated polarization electric fields are, $$\vec{E}_{PL_{QW}} = -1.56 \times 10^6 \frac{V}{cm}, \vec{E}_{PL_{QB}} = 3.89 \times 10^6 \frac{V}{cm}.$$

As seen, for most group-III visible and deep UV LEDs, the quantum well is under influence of huge polarization electric field.

One aspect of the present invention utilizes dopant induced electric field to mitigate the polarization electric field. Since the presence of electric field within quantum wells is detrimental to quantum efficiency, as explained previously in line with FIG. 1A, there is a great desire to reduce polarization electric field within quantum wells. As shown in FIG. 1A and FIG. 1B, the polarization electric field in the quantum well $\vec{E}_{PL_{QW}}$ is against c-direction, to cancel out this electric field, an additional electric field is needed to present in the quantum well in line with c-direction. According to the present invention, this can be done via incorporating p-type dopant in the right side quantum bather and/or thereafter and n-type dopant in the left side quantum barrier and/or there before. The ionized p-type and n-type dopants are of negative and positive charges, respectively. And these opposite charges on different side of the quantum well build up an electric field against the quantum well polarization electric field. With suitable doping levels, the dopant induced electric field can substantially cancel out the polarization electric field in the quantum well.

According to PN junction theory, the dopant induced PN junction maximum electric field relates to the doping levels via the equation, $E_m$, $$E_m = \sqrt{\frac{2qv_{bi}}{\varepsilon\left(\frac{1}{N_a} + \frac{1}{N_d}\right)}} = \sqrt{\frac{2KT\ln\frac{N_aN_d}{n_i^2}}{\varepsilon\left(\frac{1}{N_a} + \frac{1}{N_d}\right)}}$$

The PN junction depletion width/depth, $$W_d = \frac{2v_{bi}}{E_n}, \text{ and } v_{bi} = \frac{\frac{KT}{q}\ln(N_aN_d)}{n_i^2}.$$

Here $v_{bi}$ is the PN junction built-in potential, and $N_a$, $N_d$, $n_i$ are acceptor, donor and intrinsic carrier concentrations, respectively. Intrinsic carrier concentration depends on bandgap width ($E_g$) and effective conduction and valence band density of states ($N_c$, $N_v$) via equation $$n_i^2 = N_cN_v e^{\frac{-E_g}{KT}}.$$

Figure 2A:
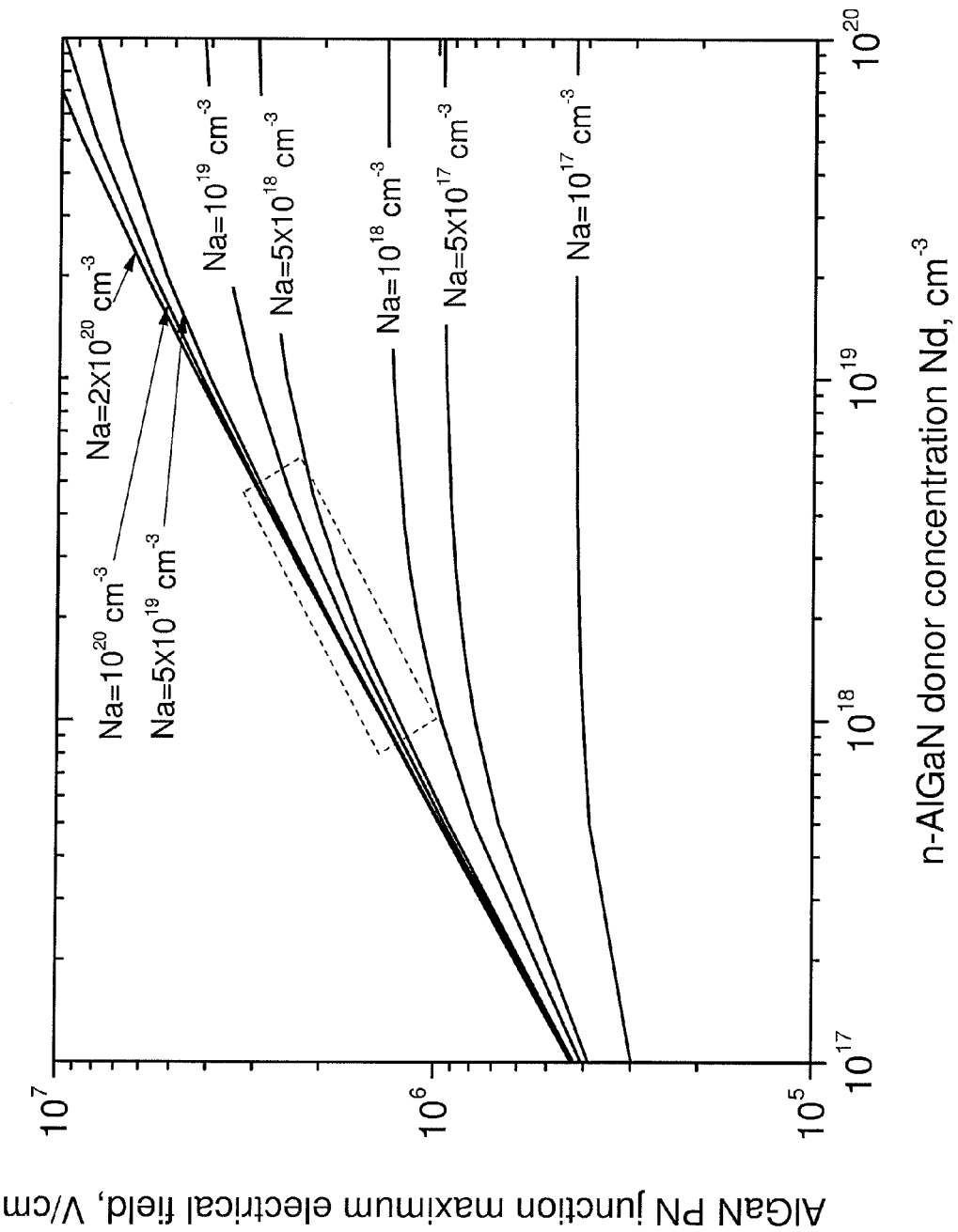
FIG. 2A plots the maximum PN junction electric field within an n-$Al_{0.6}Ga_{0.4}$N/p-$Al_{0.6}Ga_{0.4}$N PN junction as function with n-AlGaN and p-AlGaN donor and acceptor concentrations.
Figure 2B:
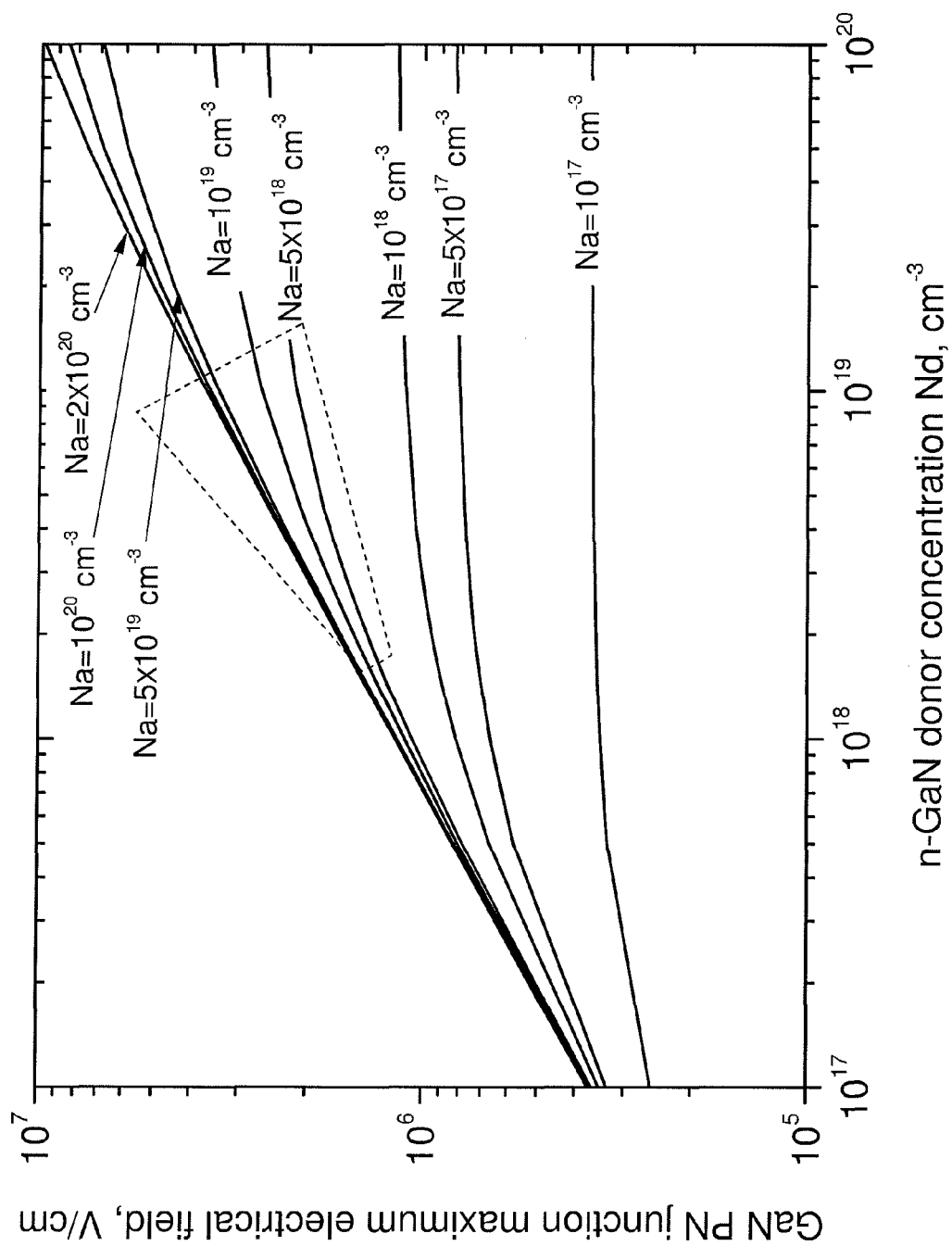
FIG. 2B plots the maximum PN junction electric field within an n-GaN/p-GaN PN junction as function with n-GaN and p-GaN donor and acceptor concentrations.

Using the above-mentioned $E_m$ equation, the PN junction maximum electric field as function of doping levels is plotted in FIG. 2A and FIG. 2B for a 280 nm deep UV LED with quantum wells sandwiched between n- and p-type $Al_{0.6}Ga_{0.4}N$ layers and a GaN PN junction based InGaN quantum well visible LED, respectively. The observation is that when the p-side acceptor concentration is less than $10^{18}$ cm$^{-3}$, the PN junction maximum electric field can hardly reach $10^6$ V/cm, regardless of the n-side donor concentration. This is also true for the n-GaN/p-GaN PN junction based visible LED (seen in FIG. 2B). Furthermore, when the n-side donor concentration is less than $5 \times 10^{17}$ cm$^{-3}$, the PN junction maximum electric field can hardly reach $10^6$ V/cm, regardless of the p-side acceptor concentration. This is also true for the n-GaN/p-GaN PN junction based visible LED when the n-side donor concentration is less than $7 \times 10^{17}$ cm$^{-3}$ (seen in FIG. 2B).

According to the present invention, high efficiency c-orientated AlGaN based UV LED and GaN based visible LED need a PN junction maximum electric field greater than $10^6$ V/cm, in order to substantially cancel/mitigate the quantum well polarization electric field. In general, GaN based visible LEDs need even higher PN junction maximum electric field since InGaN quantum wells are biased under higher polarization electric field.

Figure 3A:
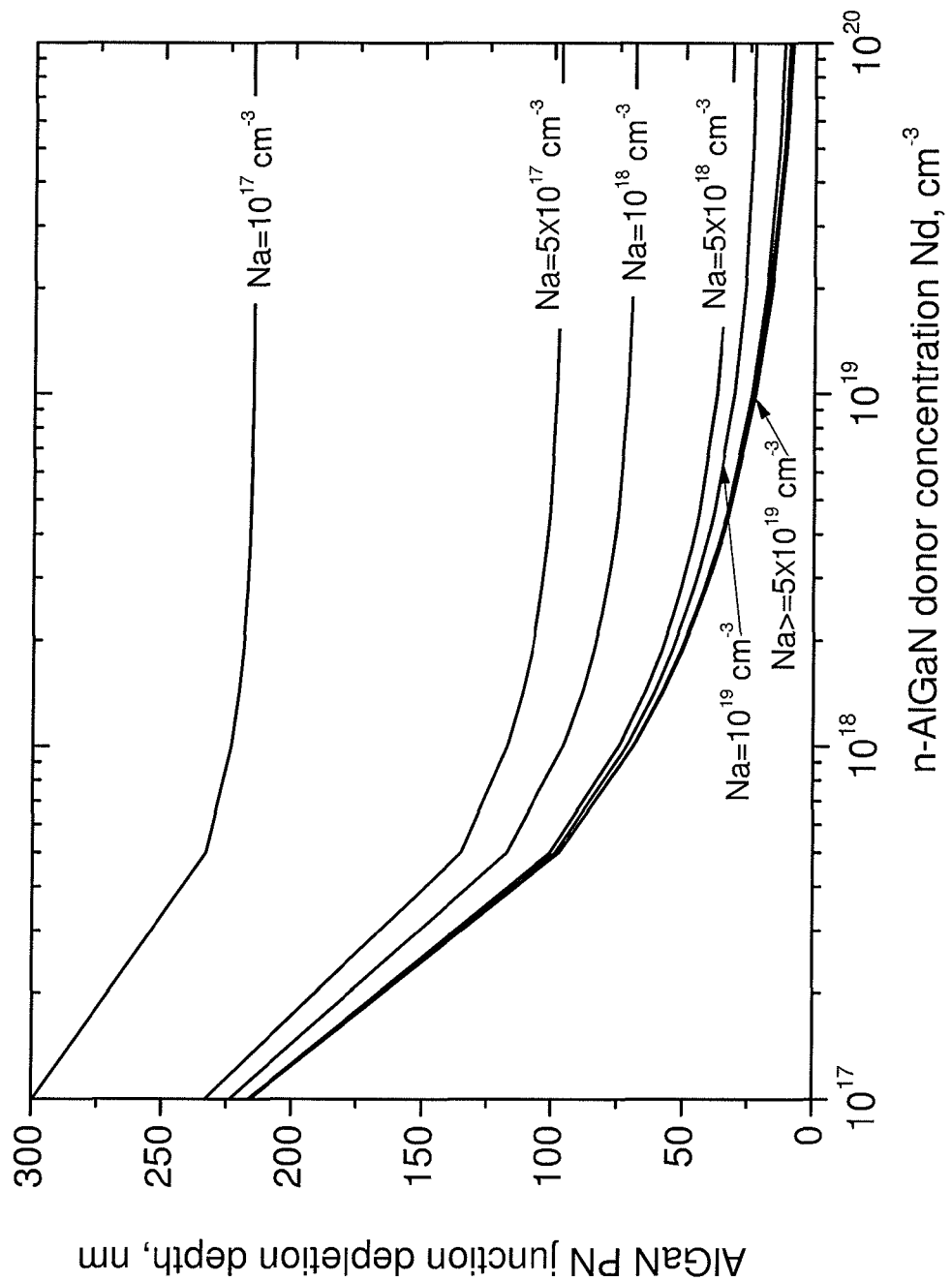
FIG. 3A plots the n-$Al_{0.6}Ga_{0.4}$N/p-$Al_{0.6}Ga_{0.4}$N PN junction depletion width as function with n-AlGaN and p-AlGaN donor and acceptor concentrations.
Figure 3B:
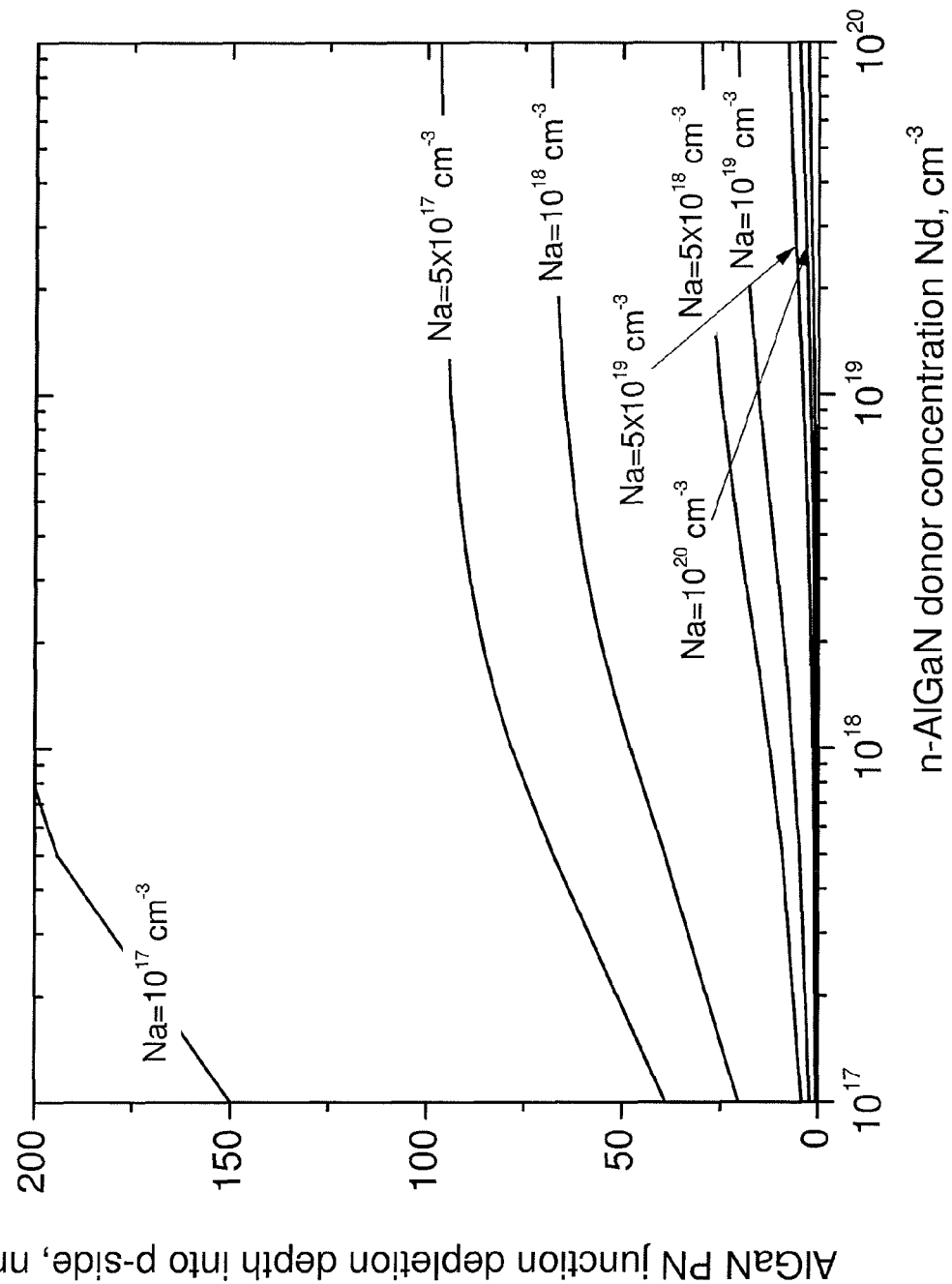
FIG. 3B plots the n-$Al_{0.6}Ga_{0.4}$N/p-$Al_{0.6}Ga_{0.4}$N PN junction depletion width into p-side as function with n-AlGaN and p-AlGaN donor and acceptor concentrations.

The PN junction maximum electric field is preferred to be presented within the light-emitting quantum wells. For this reason, the PN junction depletion zone is preferred to be within the light-emitting quantum wells. Shown in FIG. 3A and FIG. 3B are the PN junction depletion depth and depletion depth into p-side as function with doping levels. To limit the depletion zone substantially within quantum wells, the depletion depth into p-side has to be substantially small, for example, smaller than 10 nm, or smaller than 5 nm. For this reason, the p-side acceptor concentration has to be greater than $1\times10^{19}$ cm$^{-3}$, or greater than $5\times10^{19}$ cm$^{-3}$, as seen in FIG. 3B.

Considering the limited depletion depth into p-side and the required strength of PN junction maximum electric field, acceptor and donor concentrations sandwiching light emitting quantum wells of an AlGaN based deep UV LED are preferred to be within $5\times10^{18}$ cm$^{-3}$ to $2\times10^{20}$ cm$^{-3}$, and $1\times10^{18}$ cm$^{-3}$ to $1\times10^{19}$ cm$^{-3}$, respectively, more preferably to be within $1\times10^{19}$ cm$^{-3}$ to $1\times10^{20}$ cm$^{-3}$, and $1\times10^{18}$ cm$^{-3}$ to $8\times10^{18}$ cm$^{-3}$, respectively. These ranges are roughly marked out in FIG. 2A by the dashed box.

Similarly, considering the limited depletion depth into p-side and the required strength of PN junction maximum electric field, acceptor and donor concentrations sandwiching the light emitting quantum wells of a GaN based visible LED are preferred to be within $5\times10^{18}$ cm$^{-3}$ to $2\times10^{20}$ cm$^{-3}$, and $2\times10^{18}$ cm$^{-3}$ to $2\times10^{19}$ cm$^{-3}$, respectively, more preferably to be within $1\times10^{19}$ cm$^{-3}$ to $1\times10^{20}$ cm$^{-3}$, and $5\times10^{18}$ cm$^{-3}$ to $2\times10^{19}$ cm$^{-3}$, respectively. These ranges are roughly marked out in FIG. 2B by the dashed box.

Also noticed from FIG. 2A and FIG. 2B, the PN junction maximum electric field depends strongly on donor and acceptor concentrations, weakly on the semiconductor bandgap (4.84 eV for $Al_{0.6}Ga_{0.4}N$ vs 3.42 eV for GaN). Therefore it is safe to say that the above-outlined donor and acceptor concentrations in order to have the required PN junction maximum electric field are valid for $Al_xGa_{1-x}N$ PN junctions with x ranging from 0 to 1 inclusively.

The high concentrations of donors and acceptors can be realized via heavily doping. For example, silicon (Si) or germanium (Ge) can be used as donor dopant and magnesium (Mg) as acceptor dopant in group III nitride semiconductors. In the literature, acceptor concentration as high as $1\times10^{20}$ cm$^{-3}$ has been realized via heavy doping and superlattice modulation doping in GaN and AlGaN/AlGaN short period superlattice. Further, under heavy doping conditions, donors' (acceptors') wavefunction overlaps leading to donor (acceptor) impurity band formation, resulting in reduced ionization energies and improved doping efficiency. Under heavy doping conditions, donor (acceptor) concentration is substantially the same as doping concentration. (e.g. "Dependence of the Mg-related acceptor ionization energy with the acceptor concentration in p-type GaN layers grown by molecular beam epitaxy", S. Brochen, et al, APPLIED PHYSICS LETTERS 103, 032102 (2013); "Enhanced vertical and lateral hole transport in high aluminum-containing AlGaN for deep ultraviolet light emitters", B. Cheng, et al, APPLIED PHYSICS LETTERS 102, 231106 (2013), the contents of these references are incorporated herein by reference in their entirety).

The heavy doping condition can be set as close to or higher than the respective effective conduction or valence band density of states. For example, the effective conduction and valence band density of states of GaN are $2.3\times10^{18}$ cm$^{-3}$ and $4.6\times10^{19}$ cm$^{-3}$, respectively. This means that a Si (donor) doping level around or higher than $2.3\times10^{18}$ cm$^{-3}$ can be regarded as heavy n-type doping, and a Mg (acceptor) doping level around or higher than $4.6\times10^{19}$ cm$^{-3}$ can be regarded as heavy p-type doping, in group III nitrides.

Figure 4:
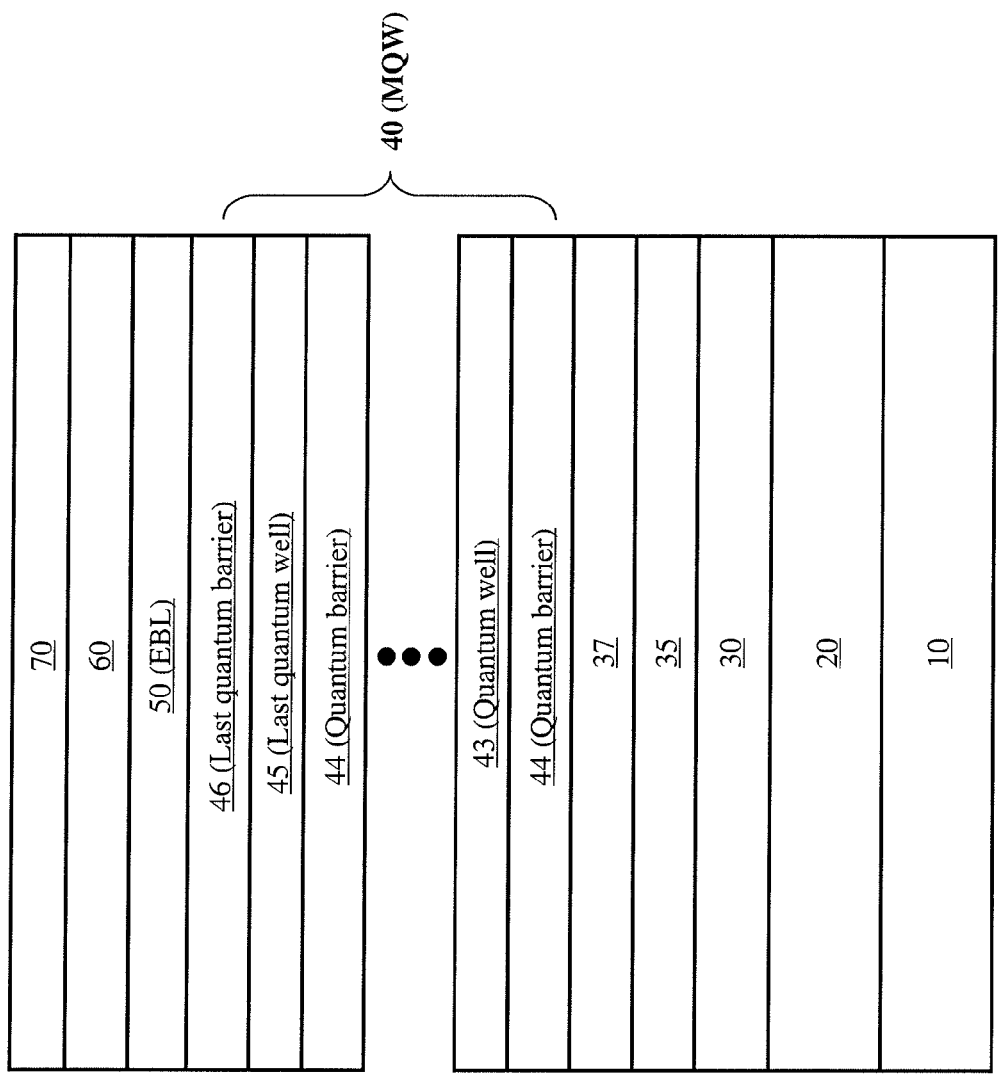
FIG. 4 illustrates the layered structure of a UV LED according to the present invention.

Shown in FIG. 4 is an illustrative layered structure of an AlGaN based UV LED according to an embodiment of the present invention. In this embodiment it is a wurtzite [0001]-oriented AlGaN ultraviolet light emitting diode. As shown substrate 10 can be selected from (111) Si, (0001) sapphire (flat or patterned), (0001) nitride (AlN, GaN, AlGaN), and the like. Formed over substrate 10 is an optional layer 20 as epitaxy template, preferably being made of AlN, or AlGaN with high Al-composition (e.g. $x_{Al}$ higher than 60%). The thickness of layer 20 is preferably to be more than 100 nm thick, for example, 1000-3000 nm thick. Following layer 20 is layer 30 serving as electron supplier layer made of n-type AlGaN, with enough thickness for good electrical conduction and material quality, preferably to be 2 μm or thicker. In order to improve the material quality of layer 30, optionally inserted in-between layer 20 and layer 30 is a strain management and defect filtering structure (not shown), which can be AlGaN/AlGaN multiple-layer heterostructure, or AlN/AlGaN multiple-layer heterostructure, or AlN/AlGaN superlattice. Epitaxially deposited over layer 30 are structure 35 and 60, sandwiching the light-emitting AlGaN/AlGaN multiple-quantum-well (MQW) active-region 40. In-between structure 35 and the AlGaN/AlGaN MQW active-region 40 there may have an undoped or low-n-type-doping (less than $5\times10^{17}$ cm$^{-3}$) nitride (such AlGaN or GaN) layer 37 of 100-300 nm thick for high-quality AlGaN quantum well formation. Structure 35 is a heavily n-type doped AlGaN layer or AlGaN/AlGaN heterostructure or superlattice, and structure 60 is a heavily p-type doped AlGaN layer or AlGaN/AlGaN heterostructure or superlattice. The dopant concentrations in structure 35 and 60 are selected to generate strong PN junction electric field, in order to substantially mitigate the polarization electric field within quantum wells 43/45, as taught previously in this specification. The acceptor concentration in structure 60 is preferred to be within $5\times10^{18}$ cm$^{-3}$ to $2\times10^{20}$ cm$^{-3}$, more preferably to be within $1\times10^{19}$ cm$^{-3}$ to $1\times10^{20}$ cm$^{-3}$, more preferably to be within $5\times10^{19}$ cm$^{-3}$ to $1\times10^{20}$ cm$^{-3}$ In order to have high acceptor doping efficiency, structure 60 is preferred to be AlGaN/AlGaN short period superlattice. In some embodiment, structure 60 is made of $Al_xGa_{1-x}N/Al_yGa_{1-y}N$ superlattice with period of 2-10 nm and periodicity of 50 to 10 (pairs) (The period of a superlattice is the thickness of the repeating layer unit and the periodicity is the repeating times). Further, the Al-composition is preferred to satisfy: $|x-y|\geq0.05$.

And the donor concentration in structure 35 is preferred to be within $1\times10^{18}$ cm$^{-3}$ to $2\times10^{19}$ cm$^{-3}$, more preferably to be within $1\times10^{18}$ cm$^{-3}$ to $8\times10^{18}$ cm$^{-3}$, more preferably to be within $3\times10^{18}$ cm$^{-3}$ to $8\times10^{18}$ cm$^{-3}$. In order to have high donor doping efficiency, structure 35 is preferred to be AlGaN/AlGaN short period superlattice. In some embodiments, structure 35 is made of $Al_xGa_{1-x}N/Al_yGa_{1-y}N$ superlattice with period of 2-10 nm and periodicity of 150 to 30 and satisfying $|x-y|\geq0.05$.

The thicknesses of structures 35 and 60 are preferred to be thicker than 300 nm (such as 300-2000 nm) and 100 nm (such as 100-1000 nm), respectively. These dopant arrangements are utilized to build up a strong PN junction electric field ($\geq 10^6$ V/cm) to mitigate the quantum well polarization electric field (FIG. 1A, $E_{PL\_QW}$) for improved light-emitting quantum efficiency.

Directly formed over active-region MQW 40 is a p-type AlGaN electron blocking layer (EBL) 50, structure 60 is formed over layer 50, and directly formed over structure 60 is a p-type GaN ohmic contact layer 70. The Al compositions or average Al compositions of layers/structures 20, 30, 35, 44, 46, 50, and 60 shown in FIG. 4 are selected to make the layers/structures transparent to the light emitted from the quantum wells 43 and last quantum 45.

The embodiment shown in FIG. 4 may have a MQW active-region design as described below. Quantum barriers 44 are preferred to be heavily n-type doped in order to build up the PN junction electric field with maximum strength located within quantum wells 43 and/or last quantum well 45. Last quantum well 45 is physical the same as quantum wells 43 except for the formation order/sequence. The n-type dopant concentration within quantum barriers 44 is selected according to the previous teachings, i.e., preferred to be within $1 \times 10^{18}$ cm$^{-3}$ to $1 \times 10^{19}$ cm$^{-3}$, more preferably to be within $1 \times 10^{18}$ cm$^{-3}$ to $8 \times 10^{18}$ cm$^{-3}$, more preferably to be within $3 \times 10^{18}$ cm$^{-3}$ to $8 \times 10^{18}$ cm$^{-3}$. Quantum wells 43/45 can be unintentionally doped or doped with n-type dopant of concentration less than $5 \times 10^{17}$ cm$^{-3}$. The last quantum barrier, namely, quantum barrier 46, inserted in-between last quantum well 45 and EBL 50 is undoped or unintentionally doped. The n-type dopant concentration within different quantum barriers 44 can be the same or different.

UV LEDs according to the embodiment shown in FIG. 4 employ the PN junction built-in electric field to mitigate the polarization electric field within the light-emitting quantum wells, leading to improved internal quantum efficiency and reduced device forward voltage (from heavy doping enhanced conductivity).

Since polarization electric field is substantially reduced via PN junction built-in electric field, quantum well band edge will be flat or much less tilted, leading to improved electron-hole wavefunction overlapping (electrons and holes will no longer be separated in real space, in sharp contrast to those shown FIG. 1A). This means the thickness of each quantum well according to the present invention can be much thicker than that used in the prior art (which is within 2-3 nm). Quantum wells 43/45 can have thickness within 2-6 nm, such as 3.5-4.5 nm. This greatly improves effective active-region volume leading to higher quantum efficiency under higher driven current densities. Further, as for UV LEDs the light-emitting quantum wells are of wide bandgap, the intrinsic carrier concentration therein is very small ($n_i < 10^{-15}$ cm$^{-3}$), heavy doping is not likely to cause notable PN junction forward and reverse leakages.

The embodiment shown in FIG. 4 can also be the illustrative layered structure of a GaN based InGaN multiple quantum well near UV or visible LED according to another aspect of the present invention. Substrate 10 can be selected from (111) Si, (0001) sapphire (flat or patterned), (0001) nitride (AlN, GaN, AlGaN), and the like. Formed over substrate 10 is layer 20 as epitaxy template, preferably being made of GaN. The thickness of layer 20 is preferably to be more than 100 nm thick, for example, 1000-3000 nm thick. Following layer 20 is layer 30 serving as electron supplier layer made of n-type GaN, with enough thickness for good electrical conduction and material quality, preferably to be 2 µm or thicker. In order to improve the material quality of layer 30, optionally inserted in-between layer 20 and layer 30 is a strain management and defect filtering structure (not shown), which can be a single AlGaN layer, or AlGaN/AlGaN multiple-layer heterostructure, or AlN/AlGaN multiple-layer heterostructure, or AlN/AlGaN superlattice. Epitaxially deposited over layer 30 are structure 35 and 60, sandwiching the light-emitting GaN/InGaN multiple-quantum-well (MQW) active-region 40. Structure 35 is a heavily n-type doped GaN layer and structure 60 is a heavily p-type doped GaN layer. The dopant concentrations in structure 35 and 60 are selected to generate strong PN junction electric field, in order to substantially mitigate the polarization electric field within quantum wells 43/45, as taught previously in this specification. The acceptor concentration in structure 60 is preferred to be within $5 \times 10^{18}$ cm$^{-3}$ to $2 \times 10^{20}$ cm$^{-3}$, more preferably to be within $1 \times 10^{19}$ cm$^{-3}$ to $1 \times 10^{20}$ cm$^{-3}$, more preferably to be within $5 \times 10^{19}$ cm$^{-3}$ to $1 \times 10^{20}$ cm$^{-3}$ In order to have high acceptor doping efficiency and avoid damage to the InGaN quantum wells within MQW active-region 40, structure 60 is preferred to be formed at temperatures close to the InGaN quantum well formation temperatures. Preferably, the formation temperature of structure 60 is higher than that of InGaN quantum wells by 20° C., or 30° C., or 50° C. In general, the formation temperature of structure 60 for the InGaN quantum well containing light-emitting device is within 720° C. to 850° C.

And the donor concentration in structure 35 is preferred to be within $5 \times 10^{18}$ cm$^{-3}$ to $2 \times 10^{19}$ cm$^{-3}$, more preferably to be within $8 \times 10^{18}$ cm$^{-3}$ to $2 \times 10^{19}$ cm$^{-3}$. This preferred high donor concentration is in response to the higher polarization field within InGaN quantum wells as compared to that in AlGaN quantum wells. Also shown in FIG. 4, in-between structure 35 and the InGaN containing MQW active-region 40 there may have an undoped or low-n-type-doping (less than $5 \times 10^{17}$ cm$^{-3}$) GaN layer 37 of 100-300 nm thick for high-quality low-temperature InGaN quantum well formation.

The thicknesses of structures 35 and 60 are preferred to be thicker than 300 nm and 100 nm, respectively. These dopant arrangements are utilized to build up a strong PN junction electric field ($\geq 10^6$ V/cm) to mitigate the quantum well polarization electric field (FIG. 1A, $E_{PL\_QW}$) for improved light-emitting quantum efficiency.

This embodiment is further characterized by its MQW active-region design. At least one quantum barriers 44 are preferred to be heavily n-type doped in order to build up the PN junction electric field with maximum strength located within quantum wells 43 and/or last quantum well 45. This at least one quantum barrier is preferred to be the first one or two quantum barriers furthest to the p-side structure 60. The n-type dopant concentration within quantum barriers 44 is selected according to the previous teachings, i.e., preferred to be within $1 \times 10^{18}$ cm$^{-3}$ to $1 \times 10^{19}$ cm$^{-3}$, more preferably to be within $1 \times 10^{18}$ cm$^{-3}$ to $8 \times 10^{18}$ cm$^{-3}$, more preferably to be within $3 \times 10^{18}$ cm$^{-3}$ to $8 \times 10^{18}$ cm$^{-3}$. Quantum wells 43/45 can be unintentionally doped or doped with n-type dopant of concentration less than $5 \times 10^{17}$ cm$^{-3}$. The last quantum barrier, namely, quantum barrier 46, inserted in-between last quantum well 45 and EBL 50 is undoped or unintentionally doped.

InGaN quantum well LEDs according to this embodiment employ the PN junction built-in electric field to mitigate the polarization electric field within the light-emitting quantum wells, leading to improved internal quantum efficiency and reduced device forward voltage (from heavy doping enhanced conductivity).

Further, since polarization electric field is substantially reduced via PN junction built-in electric field, the InGaN quantum well thickness according to the present invention can be much thicker than that used in the prior art (which is within 1.5-3 nm). Quantum wells 43/45 can have thickness within 2-6 nm, or 3.5-4.5 nm. This greatly improves effective active-region volume leading to much less efficiency droop under higher driven current densities.

Another aspect of the present invention provides a method to form a solid-state ultraviolet light emitting device, the method comprising at least these steps:

Determining quantum barrier and quantum well AlInGaN compositions for a desired emission wavelength;

Calculating strain for the quantum well coherently formed over the quantum bather (for the purpose of calculating piezoelectric polarization);

Calculating the quantum barrier/quantum well interface charge density including spontaneous and piezoelectric polarizations;

Calculating the polarization induced electric field in the quantum well;

Calculating acceptor and donor concentrations in order to have the maximum PN junction built-in electric field comparable to the quantum well polarization electric field;

Forming at least one quantum barrier with the calculated composition and donor doping level over an n-type Al-containing electron supplier layer;

Forming at least one quantum well with the calculated composition over the quantum barrier;

Forming a last quantum barrier;

Forming an Al-containing electron blocking layer over the last quantum bather;

Forming an Al-containing layer or structure with the calculated acceptor doping level over the electron blocking layer.

The present invention has been described using exemplary embodiments. However, it is to be understood that the scope of the present invention is not limited to the disclosed embodiments. On the contrary, it is intended to cover various modifications and similar arrangement or equivalents. The scope of the claims, therefore, should be accorded the broadest interpretation so as to encompass all such modifications and similar arrangements and equivalents.

What is claimed is:

1. A light emitting device comprising:
    an n-type layer;
    a p-type layer, and,
    an active region sandwiched between the n-type layer and the p-type layer, and the active-region comprising one or more quantum wells each sandwiched by quantum barriers, wherein each of the quantum wells has a polarization induced electric field, respectively, and each of the quantum barriers is doped to generate a PN junction maximum electric field equal to or greater than the polarization induced electric field of a corresponding quantum well to substantially cancel out the polarization induced electric field within each of the quantum wells;
    wherein the polarization induced electric field equal to or greater than $10^6$ V/cm; and
    wherein the n-type layer and p-type layer are made of group III nitride semiconductors, respectively, and the n-type layer is doped with Si or Ge with a concentration within $1 \times 10^{18}$ cm$^{-3}$ to $2 \times 10^{19}$ cm$^{-3}$, and the p-type layer is doped with Mg with a concentration within $5 \times 10^{18}$ cm$^{-3}$ to $2 \times 10^{20}$ cm$^{-3}$.

2. The light-emitting device according to claim 1, wherein the n-type layer is doped with Si or Ge with a concentration within $3 \times 10^{18}$ cm$^{-3}$ to $8 \times 10^{18}$ cm$^{-3}$.

3. The light-emitting device according to claim 1, wherein the p-type layer is doped with Mg with a concentration within $5 \times 10^{19}$ cm$^{-3}$ to $1 \times 10^{20}$ cm$^{-3}$.

4. The light-emitting device according to claim 1, wherein the n-type layer comprises $Al_xGa_{1-x}N/Al_yGa_{1-y}N$ superlattice with period of 2-10 nm and periodicity of 150 to 30 and satisfying: $|x\ y| \geq 0.05$.

5. The light-emitting device according to claim 1, wherein the p-type layer comprises $Al_xGa_{1-x}N/Al_yGa_{1-y}N$ superlattice with period of 2-10 nm and periodicity of 50 to 10 and satisfying: $|x-y| \geq 0.05$.

6. The light-emitting device according to claim 1, wherein each of the quantum wells is made of Al-containing III nitride semiconductor unintentionally doped or doped with n-type dopant of concentration less than $5 \times 10^{17}$ cm$^{-3}$ and having a thickness 2 nm to 6 nm, emitting light with a wavelength within 230 nm to 590 nm, and each of the quantum barriers is made of Al-containing III nitride semiconductor and n-type doped with Si or Ge with a concentration within $1 \times 10^{18}$ cm$^{-3}$ to $1 \times 10^{19}$ cm$^{-3}$.

7. The light-emitting device according to claim 6, wherein each of the quantum barriers is n-type doped with Si or Ge with a concentration within $3 \times 10^{18}$ cm$^{-3}$ to $8 \times 10^{18}$ cm$^{-3}$.

8. The light-emitting device according to claim 6, wherein each of the quantum wells has a thickness 3.5 nm to 6 nm.

9. The light-emitting device according to claim 1, further comprising a substrate over which the n-type layer is formed, wherein the substrate is selected from Si, sapphire, or nitride.

10. The light-emitting device according to claim 9, further comprising an electron supplier layer made of n-type AlGaN and sandwiched between the substrate and the n-type layer.

11. The light-emitting device according to claim 1, further comprising an undoped or low n-type-doping (less than $5 \times 10^{17}$ cm$^{-3}$) nitride layer of a thickness 100-300 nm formed between the n-type layer and the active region.

12. The light-emitting device according to claim 1, further comprising a p-type AlGaN electron blocking layer (EBL) formed directly on the active region and sandwiched between the active region and the p-type layer.

13. The light-emitting device according to claim 12, wherein a last quantum barrier directly inserted between a last quantum well and the EBL is undoped or unintentionally doped.

14. A method for forming a solid-state light emitting device comprising:
    determining compositions of a quantum barrier and a quantum well of an active region for a desired emission wavelength;
    calculating strain for the quantum well coherently formed over the quantum barrier;
    calculating quantum barrier/quantum well interface charge density including spontaneous and piezoelectric polarizations;
    calculating a polarization induced electric field in the quantum well;
    calculating acceptor concentration in a p-type layer and donor concentration in the quantum barrier needed to generate a maximum PN junction built-in electric field comparable to the polarization induced electric field in the quantum well;
    forming the quantum barrier with the calculated composition and donor concentration over an n-type electron supplier layer;
    forming the quantum well with the calculated composition over the quantum barrier;
    forming a last quantum barrier over the quantum well;
    forming an Al-containing electron blocking layer over the last quantum barrier;
    forming the p-type layer with the calculated acceptor concentration over the electron blocking layer.

15. A light emitting device comprising:
an n-type layer;
a p-type layer;
an active region sandwiched between the n-type layer and the p-type layer, and the active-region comprising one or more quantum wells each sandwiched by quantum barriers, wherein at least one of the quantum wells has a polarization induced electric field, and at least one of the quantum barriers adjacent to the at least one of the quantum wells is doped to generate a PN junction maximum electric field equal to or greater than the polarization induced electric field to substantially cancel out the polarization induced electric field within the at least one of the quantum wells;
a substrate over which the n-type layer is formed, wherein the substrate is selected from Si, sapphire, or nitride; and
an electron supplier layer made of n-type AlGaN and sandwiched between the substrate and the n-type layer.

16. A light emitting device comprising:
an n-type layer;
a p-type layer;
an active region sandwiched between the n-type layer and the p-type layer, and the active-region comprising one or more quantum wells each sandwiched by quantum barriers, wherein at least one of the quantum wells has a polarization induced electric field, and at least one of the quantum barriers adjacent to the at least one of the quantum wells is doped to generate a PN junction maximum electric field equal to or greater than the polarization induced electric field to substantially cancel out the polarization induced electric field within the at least one of the quantum wells; and
an undoped or low n-type-doping (less than $5\times10^{17}$ cm$^{-3}$) nitride layer of a thickness 100-300 nm formed between the n-type layer and the active region.

17. A light emitting device comprising:
an n-type layer;
a p-type layer;
an active region sandwiched between the n-type layer and the p-type layer, and the active-region comprising one or more quantum wells each sandwiched by quantum barriers, wherein at least one of the quantum wells has a polarization induced electric field, and at least one of the quantum barriers adjacent to the at least one of the quantum wells is doped to generate a PN junction maximum electric field equal to or greater than the polarization induced electric field to substantially cancel out the polarization induced electric field within the at least one of the quantum wells; and
a p-type AlGaN electron blocking layer (EBL) formed directly on the active region and sandwiched between the active region and the p-type layer, wherein a last quantum barrier directly inserted between a last quantum well and the EBL is undoped or unintentionally doped.

* * * * *